(12) United States Patent
Wen et al.

(10) Patent No.: US 10,586,717 B2
(45) Date of Patent: Mar. 10, 2020

(54) SEMICONDUCTOR PROCESSING APPARATUS AND METHOD

(71) Applicant: Wuxi Huaying Microelectronics Technology Co., Ltd, Wuxi, Jiangsu (CN)

(72) Inventors: Sophia Wen, Jiangsu (CN); Zhikai Wang, Jiangsu (CN)

(73) Assignee: WUXI HUAYING MICROELECTRONICS TECHNOLOGY CO., LTD, Wuxi, Jiangsu (CN)

( * ) Notice: Subject to any disclaimer, the term of this patent is extended or adjusted under 35 U.S.C. 154(b) by 0 days.

(21) Appl. No.: 15/779,514

(22) PCT Filed: Dec. 21, 2015

(86) PCT No.: PCT/CN2015/098101
§ 371 (c)(1),
(2) Date: May 25, 2018

(87) PCT Pub. No.: WO2017/088221
PCT Pub. Date: Jun. 1, 2017

(65) Prior Publication Data
US 2018/0350635 A1    Dec. 6, 2018

(30) Foreign Application Priority Data
Nov. 25, 2015    (CN) .......................... 2015 1 0836143

(51) Int. Cl.
*H01L 21/67*        (2006.01)
*H01L 21/673*      (2006.01)
(Continued)

(52) U.S. Cl.
CPC ........ *H01L 21/67023* (2013.01); *H01L 21/02* (2013.01); *H01L 21/67* (2013.01);
(Continued)

(58) Field of Classification Search
None
See application file for complete search history.

(56) References Cited

U.S. PATENT DOCUMENTS

| 6,461,155 B1 * | 10/2002 | Settles | B01J 3/008 |
| | | | 118/725 |
| 2003/0077854 A1 * | 4/2003 | Teshirogi | B24B 37/042 |
| | | | 438/113 |

(Continued)

*Primary Examiner* — Angel Roman
(74) *Attorney, Agent, or Firm* — Han IP PLLC; Andy M. Han

(57) ABSTRACT

A semiconductor processing apparatus is provided. The apparatus includes a first chamber portion and a second chamber portion movable relative to the first chamber portion between an open position and a closed position. The first chamber portion includes a recessed area formed on an internal surface of the first chamber portion. The first chamber portion also includes one or more through-holes connected to respective locations of the recessed area. When the second chamber portion is in the closed position and a semiconductor wafer is housed in the micro chamber, the recessed area is sealed by a surface of the semiconductor wafer to form a closed channel. The surface may be processed by a processing fluid flowing in the closed channel. Accordingly, a flowing direction and a flowing speed of the processing fluid may be accurately controlled, and an amount of the processing fluid consumed may be greatly reduced.

15 Claims, 13 Drawing Sheets

(51) Int. Cl.
*H01L 21/677* (2006.01)
*H01L 21/02* (2006.01)
*H01L 21/687* (2006.01)
*H01L 21/683* (2006.01)

(52) U.S. Cl.
CPC .... *H01L 21/6715* (2013.01); *H01L 21/67109* (2013.01); *H01L 21/67161* (2013.01); *H01L 21/67386* (2013.01); *H01L 21/67393* (2013.01); *H01L 21/67778* (2013.01); *H01L 21/6838* (2013.01); *H01L 21/68785* (2013.01)

(56) References Cited

U.S. PATENT DOCUMENTS

| | | | |
|---|---|---|---|
| 2003/0102682 A1* | 6/2003 | Kurokawa | H01L 21/6838 294/188 |
| 2006/0032037 A1* | 2/2006 | Lo | H01L 21/67126 29/464 |
| 2007/0190200 A1* | 8/2007 | Cherala | B82Y 10/00 425/385 |
| 2012/0040500 A1* | 2/2012 | Lin | H01L 21/561 438/127 |
| 2012/0080832 A1* | 4/2012 | Woodard | B23Q 3/084 269/289 R |
| 2019/0035644 A1* | 1/2019 | Wen | H01L 21/02 |

\* cited by examiner

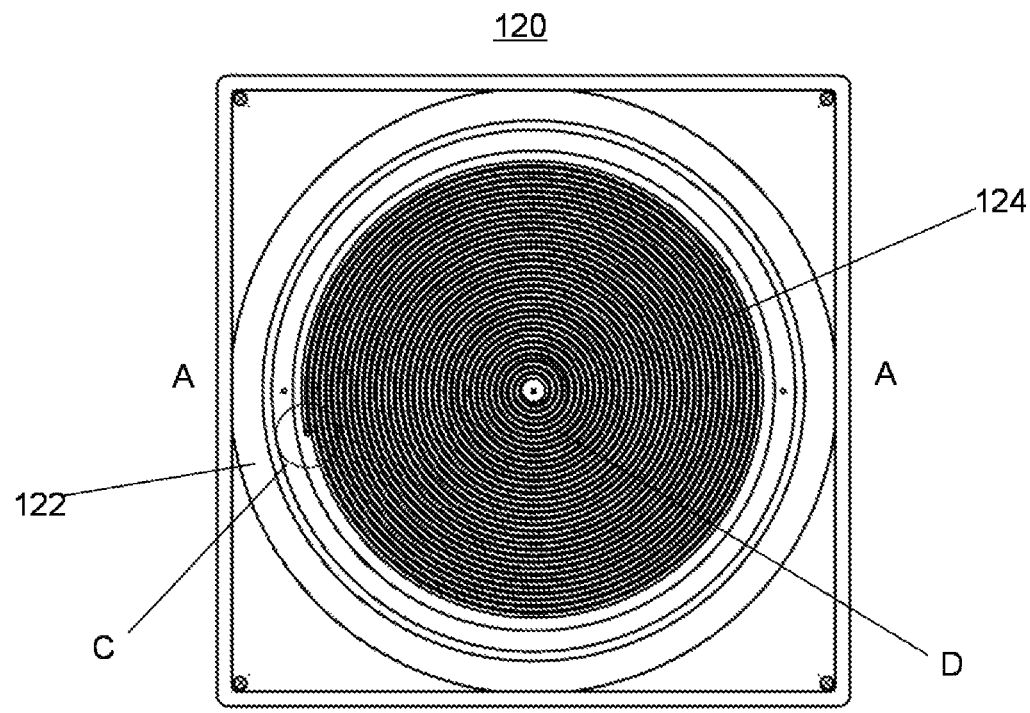
FIG. 2a
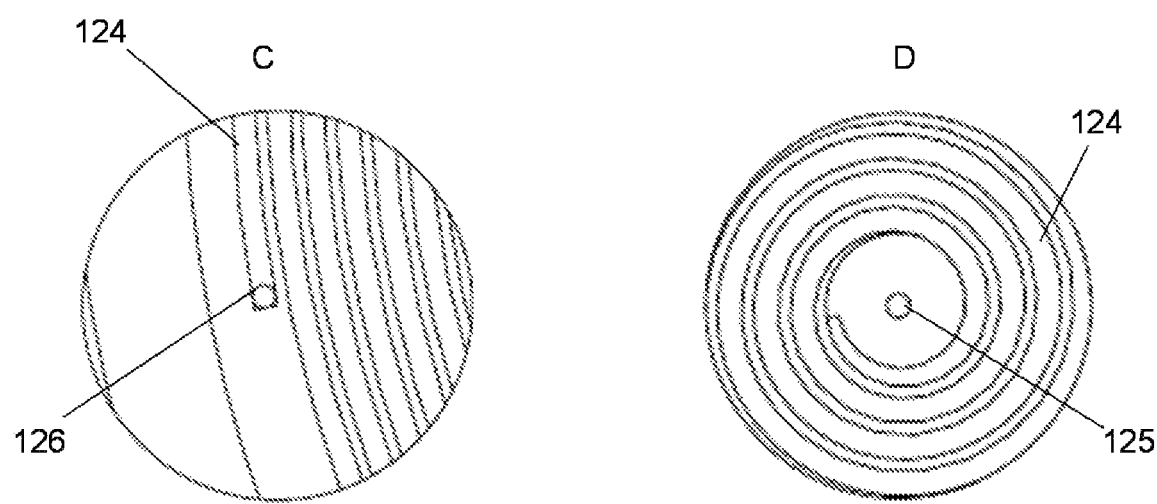
FIG. 2b
FIG. 2c

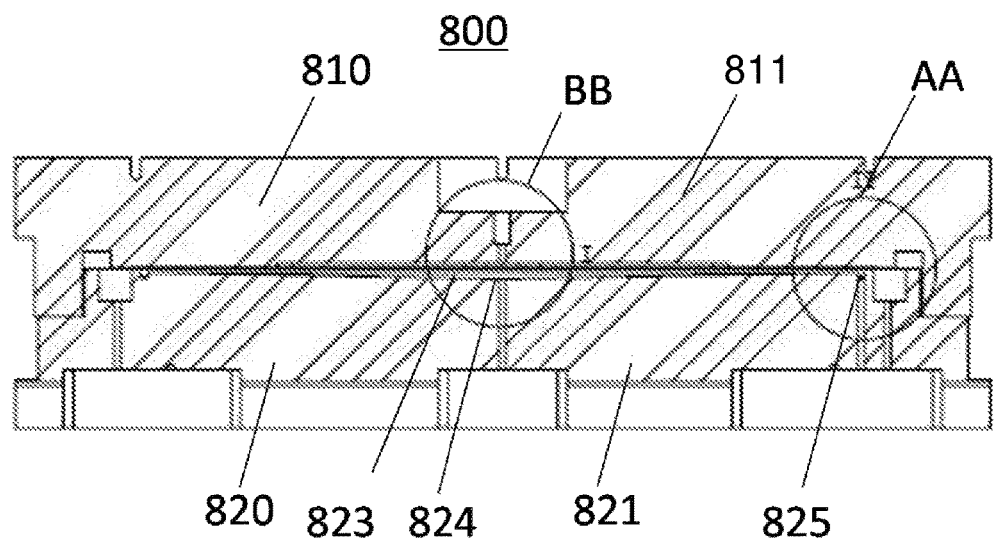
FIG. 8a
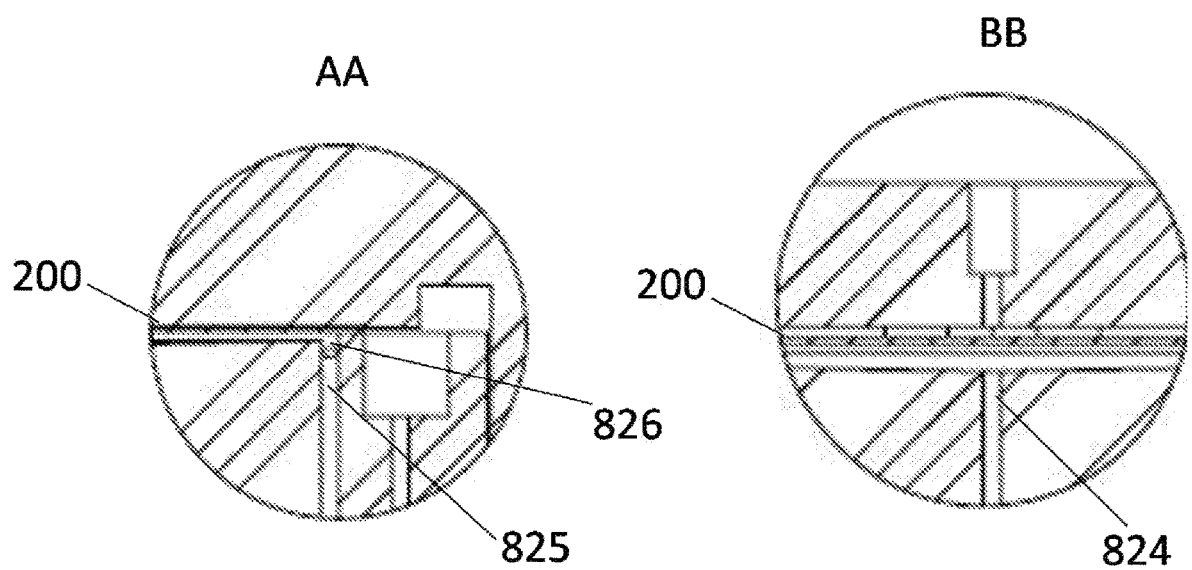
FIG. 8b
FIG. 8c

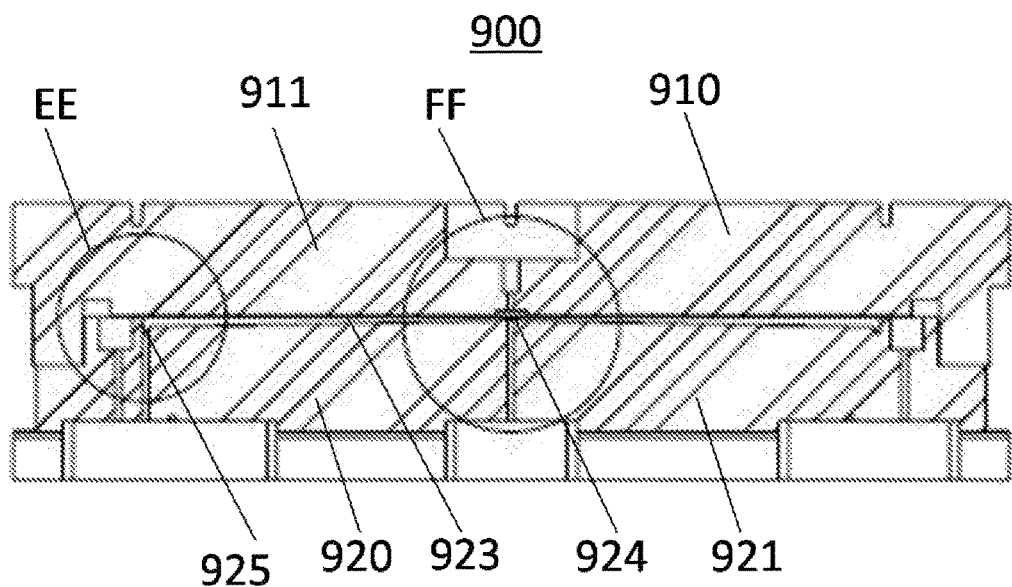
FIG. 9a
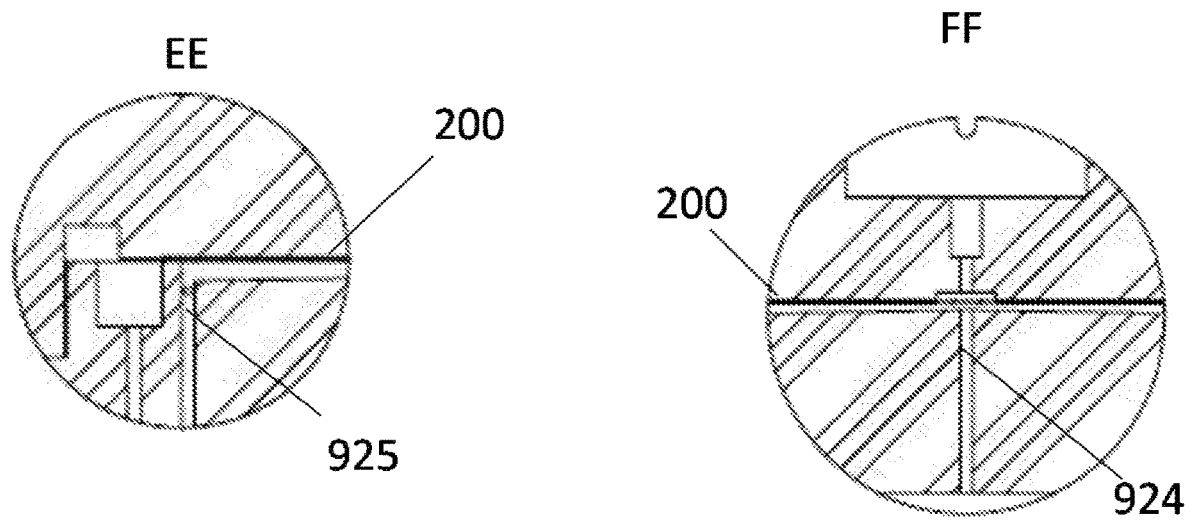
FIG. 9b
FIG. 9c

SEMICONDUCTOR PROCESSING APPARATUS AND METHOD

CROSS-REFERENCE TO RELATED APPLICATION

This application is the U.S. national stage application of International Application No. PCT/CN2015/098101, filed on Dec. 21, 2015, which claims the priority benefit of China Patent Application No. 201510836143.0, filed on Nov. 25, 2015. The above-identified patent applications are hereby incorporated by reference in their entirety.

TECHNICAL FIELD

The present disclosure generally relates to a fabrication process of semiconductor materials and, more particularly, to a semiconductor processing apparatus and a method thereof.

BACKGROUND

Each of Chinese patent applications 201210171681.9 and 201210088237.0 discloses a micro chamber processing apparatus for processing a semiconductor wafer. The micro chamber processing apparatus includes an upper chamber portion and a lower chamber portion. Driven by a driving device, the upper and lower chamber portions may relatively move between an open position for loading and/or unloading the semiconductor wafer, and a closed position for accommodating and processing the semiconductor wafer. A micro chamber is formed when the upper and lower chamber portions are disposed in the closed position, and the semiconductor wafer is placed in the micro chamber. Either or both of the upper and lower chamber portions may include one or more inlets, via which processing fluid may enter the micro chamber, and one or more outlets, via which the processing fluid may exit the micro chamber.

The upper chamber portion has a horizontal surface, referred to as an upper working surface, that faces the micro chamber. The lower chamber portion also has a horizontal surface, referred to as a lower working surface, that faces the micro chamber. It is difficult to control the processing fluid when the processing fluid enters the micro chamber via the one or more inlets, and the processing fluid may flow in random directions. Moreover, the micro chamber processing apparatus needs a rather large quantity of the processing fluid, which makes detecting a low-level chemical at a surface of the semiconductor wafer an extremely difficult task. That is, the chemical would dissolve in the rather large quantity of the processing fluid, and the density of the chemical would become very low and thus extremely difficult to detect.

SUMMARY

This section is for the purpose of summarizing some aspects of the present disclosure and to briefly introduce some preferred embodiments. Simplifications or omissions in this section as well as in the abstract or the title of this description may be made to avoid obscuring the purpose of this section, the abstract and the title. Such simplifications or omissions are not intended to limit the scope of the present disclosure.

A purpose of the present disclosure is to provide a semiconductor processing apparatus and method, via which an accurate control of a flowing direction and a flowing speed of the processing fluid may be achieved. Meanwhile, the quantity of the processing fluid used may be greatly reduced.

In order to realize the aforementioned purpose, a semiconductor processing apparatus is provided as an embodiment according to the present disclosure. The semiconductor processing apparatus includes a first chamber portion, as well as a second chamber portion that is movable relative to the first chamber portion between an open position and a closed position. When the second chamber portion is in the closed position relative to the first chamber portion, a micro chamber is formed between the first chamber portion and the second chamber portion. The micro chamber is configured to house a semiconductor wafer. When the second chamber portion is in the open position relative to the first chamber portion, the micro chamber is configured for the semiconductor wafer to be transferred into or out of the micro chamber. The first chamber portion includes a recessed groove formed on an internal surface of the first chamber portion. The internal surface faces the micro chamber. The first chamber portion also includes a first through-hole and a second through-hole. The first through-hole passes through the first chamber portion from an outer side of the first chamber portion, and connects to a first location of the recessed groove. The second through-hole passes through the first chamber portion from an outer side of the first chamber portion, and connects to a second location of the recessed groove. When the second chamber portion is in the closed position relative to the first chamber portion and the semiconductor wafer is housed in the micro chamber, a surface of the semiconductor wafer abuts against the internal surface. The recessed groove is thus sealed by the surface of the semiconductor wafer to form a closed channel. The closed channel is connected to the outer side of the first chamber portion via the first through-hole and the second through-hole.

Furthermore, the closed channel is configured to receive a fluid via the first through-hole. The fluid is guided by the closed channel and proceeds along the closed channel such that the fluid contacts and processes at least a partial area of the surface of the semiconductor wafer. After processing at least the partial area of the surface of the semiconductor wafer, the fluid is configured to be removed from the closed channel via the second through-hole.

Moreover, the first through-hole includes a first buffering mouth portion and a first through-hole portion. The first buffering mouth portion is directly connected to the recessed groove, and is deeper and wider than the recessed groove. The first through-hole portion is directly connected to the first buffering mouth portion. The second through-hole includes a second buffering mouth portion and a second through-hole portion. The second buffering mouth portion is directly connected to the recessed groove, and is deeper and wider than the recessed groove. The second through-hole portion is directly connected to the second buffering mouth portion.

In addition, the second chamber portion also includes a recessed groove that is formed on an internal surface of the second chamber portion. The internal surface of the second chamber portion also faces the micro chamber. A groove wall portion of the internal surface of the first chamber portion opposes a groove wall portion of the internal surface of the second chamber portion.

According to another aspect of the present disclosure, a semiconductor processing method using the semiconductor processing apparatus described above is presented. The method involves positioning the second chamber portion in the open position relative to the first chamber portion. The method also involves placing the semiconductor wafer between the first and second chamber portions. The method also involves positioning the second chamber portion in the closed position relative to the first chamber portion. The method also involves injecting an extraction fluid into the closed channel via the first through-hole. The extraction fluid may proceed along the closed channel and reaches the second through-hole. The method further involves extracting the extraction fluid via the second through-hole.

Furthermore, the extraction fluid is driven by a driving fluid to proceed along the closed channel and reach the second through-hole. The extraction fluid is either a liquid or a gas, whereas the driving fluid is an inert ultra-pure gas or liquid.

Moreover, prior to the injecting of the extraction fluid via the first through-hole, the method may also involve injecting a reaction fluid into the recessed groove via the first through-hole. The reaction fluid may thus have a reaction with at least a partial area of the surface of the semiconductor wafer that the reaction fluid contacts.

Different from existing techniques of detection and analysis, the present disclosure proposes a recessed groove disposed on an internal surface of a chamber portion. The recessed groove is sealed by a semiconductor wafer, thus forming a closed channel. As a processing fluid flows in the closed channel, the processing fluid may process a surface of the semiconductor wafer. Accordingly, a flowing direction and a flowing speed of the processing fluid may be accurately controlled. In addition, the amount of the processing fluid consumed may be greatly reduced.

BRIEF DESCRIPTION OF THE DRAWINGS

The present disclosure may be better understood by referring to the drawings as well as the detailed description below. In particular, same numerals are used to refer to same structural parts throughout the drawings.

FIG. 1b illustrates a zoom-in view of circle A of FIG. 1a;

FIG. 1c illustrates a zoom-in view of circle B of FIG. 1a;

FIG. 2a is an upper view of a lower chamber portion according to an embodiment of the present disclosure;

FIG. 2b illustrates a zoom-in view of circle C of FIG. 2a;

FIG. 2c illustrates a zoom-in view of a circular area around a location indicated by label D of FIG. 2a;

FIG. 2d illustrates a sectional view along sectional line A-A of FIG. 2a;

FIG. 3b illustrates a zoom-in view of circle G of FIG. 3a;

FIG. 3c illustrates a zoom-in view of circle H of FIG. 3a;

FIG. 3d illustrates a sectional view along sectional line B-B of FIG. 3a;

FIG. 4b illustrates a zoom-in view of circle K of FIG. 4a;

FIG. 5b illustrates a sectional view along sectional line C-C of FIG. 5a;

FIG. 6b illustrates a zoom-in view of circle M of FIG. 6a;

FIG. 8a is a sectional view of a semiconductor processing apparatus according to an embodiment of the present disclosure;

FIG. 8b illustrates a zoom-in view of circle AA of FIG. 8a;

FIG. 8c illustrates a zoom-in view of circle BB of FIG. 8a;

FIG. 9a is a sectional view of a semiconductor processing apparatus according to an embodiment of the present disclosure;

FIG. 9b illustrates a zoom-in view of circle EE of FIG. 9a;

FIG. 9c illustrates a zoom-in view of circle FF of FIG. 9a;

FIG. 11b illustrates a zoom-in view of circle GG of FIG. 11a.

DETAILED DESCRIPTION OF THE PREFERRED EMBODIMENTS

To make the above objects, features and advantages of the present disclosure more obvious and easier to understand, the present disclosure is further described in detail below using various embodiments.

Reference herein to "one embodiment" or "an embodiment" means that a particular feature, structure, or characteristic described in connection with the embodiment can be comprised in at least one embodiment of the present disclosure. The appearances of the phrase "in one embodiment" in various places in the specification are not necessarily all referring to the same embodiment, nor are separate or alternative embodiments mutually exclusive of other embodiments. Reference herein to "a plurality of" and "a number of" indicates a quantity of two or more. Reference herein to "and/or" means "and" or "or".

The present disclosure provides a semiconductor processing apparatus. The apparatus is capable of accurately controlling a flowing direction and a flowing speed of a processing fluid. In addition, the amount of the processing fluid consumed may be greatly reduced.

Figure 1A:
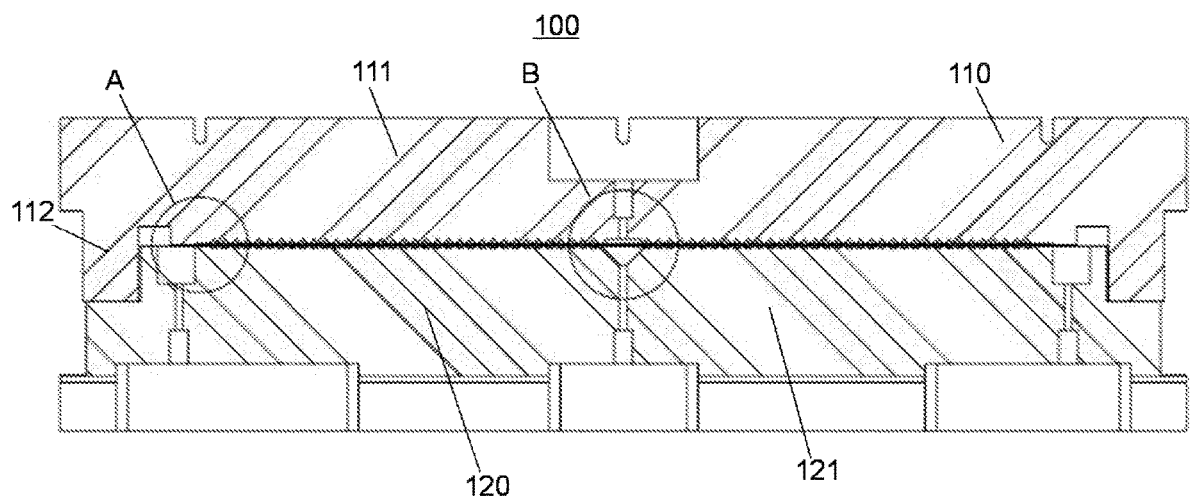
FIG. 1a is a sectional view of a semiconductor processing apparatus according to an embodiment of the present disclosure.
Figure 1B:
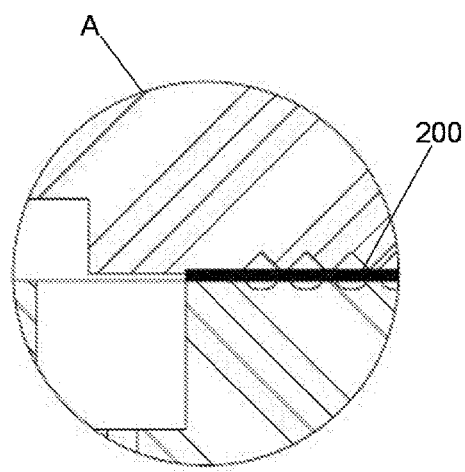
Figure 1C:
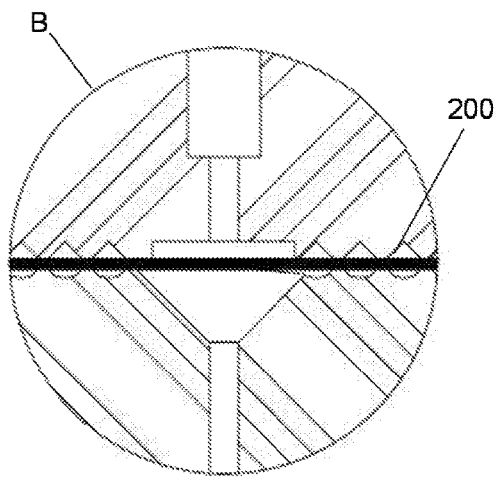

FIG. 1a is a sectional view of a semiconductor processing apparatus 100 according to an embodiment of the present disclosure. FIG. 1b illustrates a zoom-in view of circle A of FIG. 1a, and FIG. 1c illustrates a zoom-in view of circle B of FIG. 1a. As shown in FIG. 1a, semiconductor processing apparatus 100 includes an upper chamber portion 110 and a lower chamber portion 120.

Upper chamber portion 110 may include an upper chamber board 111 and a first protruding edge 112 that extends downward from a circumferential region of upper chamber board 111. Lower chamber portion 120 may include a lower chamber board 121 and a first indentation 122 that indents downward at a circumferential region of lower chamber board 121. First indentation 122 is shown in FIG. 2d.

Upper chamber portion 110 may be movable relative to lower chamber portion 120 between an open position and a closed position. When upper chamber portion 110 is in the open position relative to lower chamber portion 120, a semiconductor wafer may be placed on an internal surface of lower chamber portion 120, or removed from the internal surface of lower chamber portion 120. When upper chamber portion 110 is in the closed position relative to lower chamber portion 120, first protruding edge 112 may mate with first indentation 122 and form a sealed micro chamber between upper chamber board 111 and lower chamber board 121. The semiconductor wafer may be housed or otherwise accommodated in the micro chamber for subsequent processing.

Figure 2D:
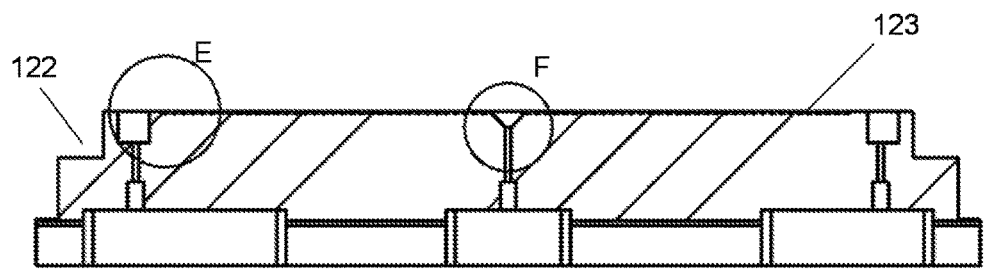
Figure 2E:
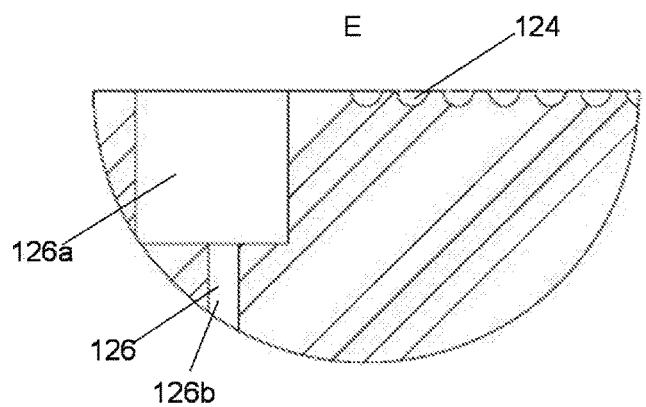
FIG. 2e illustrates a zoom-in view of circle E of FIG. 2d.
Figure 2F:
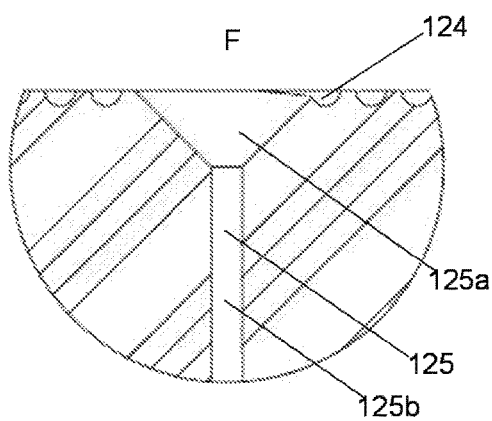
FIG. 2f illustrates a zoom-in view of circle F of FIG. 2d.

FIG. 2a is an upper view of lower chamber portion 120 according to an embodiment of the present disclosure. FIG. 2b illustrates a zoom-in view of circle C of FIG. 2a, whereas FIG. 2c illustrates a zoom-in view of a circular area around a location indicated by label D of FIG. 2a. FIG. 2d illustrates a sectional view along a sectional line A-A of FIG. 2a. FIG. 2e illustrates a zoom-in view of circle E of FIG. 2d, whereas FIG. 2f illustrates a zoom-in view of circle F of FIG. 2d.

As illustrated in FIGS. 2a-2f, lower chamber portion 120 may have a recessed groove 124 formed on an internal surface 123 (which faces the micro chamber) of lower chamber portion 120. In addition, lower chamber portion 120 may also have a first through-hole 125 and a second through-hole 126. First through-hole 125 may pass through lower chamber portion 120 from an outer side of lower chamber portion 120 and connect to a first location of recessed groove 124. Second through-hole 126 may pass through lower chamber portion 120 from the outer side of lower chamber portion 120 and connect to a second location of recessed groove 124. Recessed groove 124 may have a cross-section that is U-shaped, V-shaped, or semicircular. Alternatively, the cross-section of recessed groove 124 may be of other shapes. A total number of through-holes connected to recessed groove 124 may be one or more.

As shown in FIGS. 1a, 1b and 1c, a semiconductor wafer 200 may be housed or accommodated in the micro chamber when upper chamber portion 110 is in the closed position relative to lower chamber portion 120. A surface (i.e., a lower surface) of semiconductor wafer 200 may abut against internal surface 123, on which recessed groove 124 is formed. Recessed groove 124 may thus be blocked or otherwise sealed by the surface of semiconductor wafer 200 to form a closed channel. The closed channel may be connected to the outer side of lower chamber portion 120 via first through-hole 125 and second through-hole 126. When semiconductor processing apparatus 100 is in operation, a processing fluid may enter the closed channel via first through-hole 125 and proceed in, as guided by, the closed channel. Therefore, the processing fluid may contact and process at least a partial area of the surface of semiconductor wafer 200. After processing at least the partial area of the surface of semiconductor wafer 200, the processing fluid may flow through second through-hole 126 and be extracted. Accordingly, a flowing direction and a flowing speed of the processing fluid may be accurately controlled. Moreover, an amount of the processing fluid consumed may be greatly reduced.

In an embodiment as shown in FIGS. 2a, 2b and 2c, recessed groove 124 may be formed into a spiral. First through-hole 125 may be located in a central region (e.g., a region close to the circular area around the location indicated by label D of FIG. 2a) of the spiral-shaped recessed groove 124, whereas second through-hole 126 may be located in a peripheral region (e.g., a region within circle C) of the spiral-shaped recessed groove 124. First through-hole 125 may be used as an inlet, and second through-hole 126 may be used as an outlet. In some embodiments, alternatively, first through-hole 125 may be used as an outlet, and second through-hole 126 may be used as an inlet.

In an embodiment as shown in FIGS. 2d, 2e and 2f, first through-hole 125 may include a first buffering mouth portion 125a and a first through-hole portion 125b. First buffering mouth portion 125a may be directly connected to recessed groove 124, and may be deeper and wider than recessed groove 124. First through-hole portion 125b may be directly connected to first buffering mouth portion 125a. Without first buffering mouth portion 125a, the processing fluid would have entered recessed groove 124 with an initial flowing speed that is too high and thus over-processed a central region of semiconductor wafer 200. Similarly, second through-hole 126 may include a second buffering mouth portion 126a and a second through-hole portion 126b. Second buffering mouth portion 126a may be directly connected to recessed groove 124, and may be deeper and wider than recessed groove 124. Second through-hole portion 126b may be directly connected to second buffering mouth portion 126a. Without second buffering mouth portion 126a, the processing fluid would not be able to exit recessed groove 124 via second through-hole 126 in a timely manner, and may thus overflow. Preferably, first buffering mouth portion 125a may be a cone-shaped recess, and second buffering mouth portion 126a may be a cylinder-shaped recess.

Figure 3A:
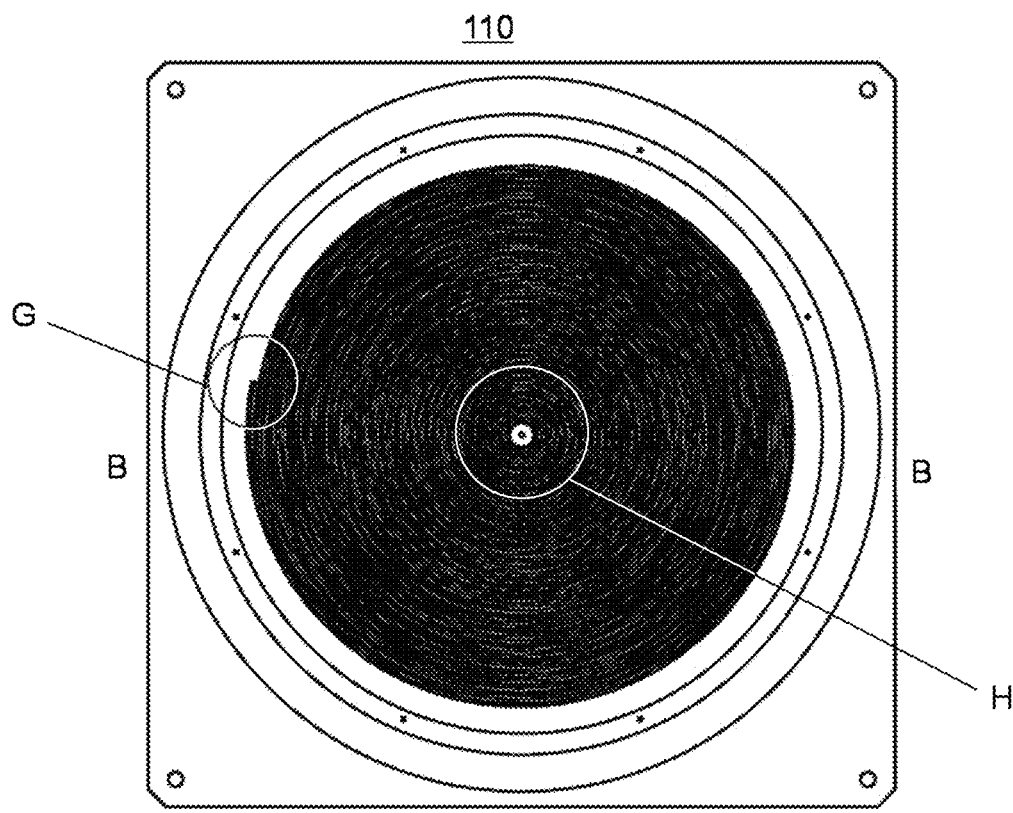
FIG. 3a is a bottom view of an upper chamber portion according to an embodiment of the present disclosure.
Figures 3B, 3C:
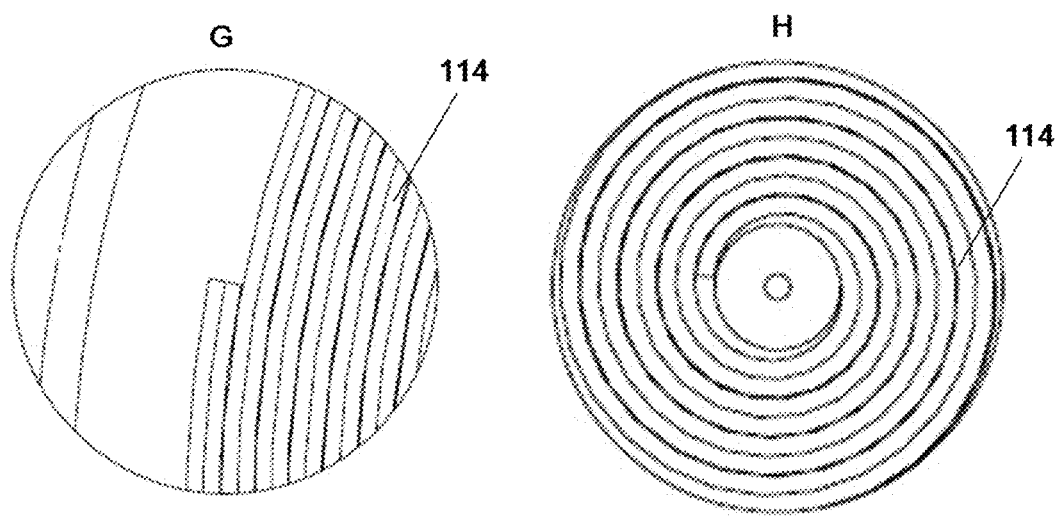
Figure 3D:
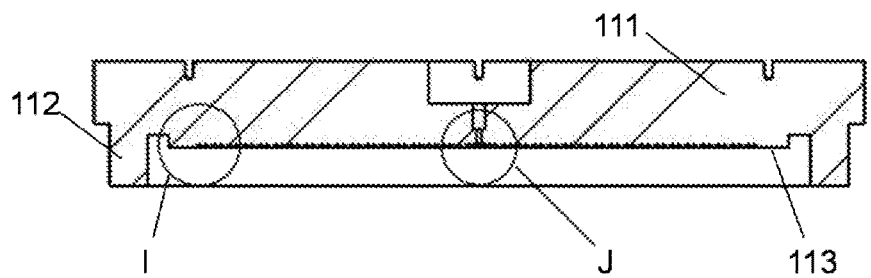
Figures 3E, 3F:
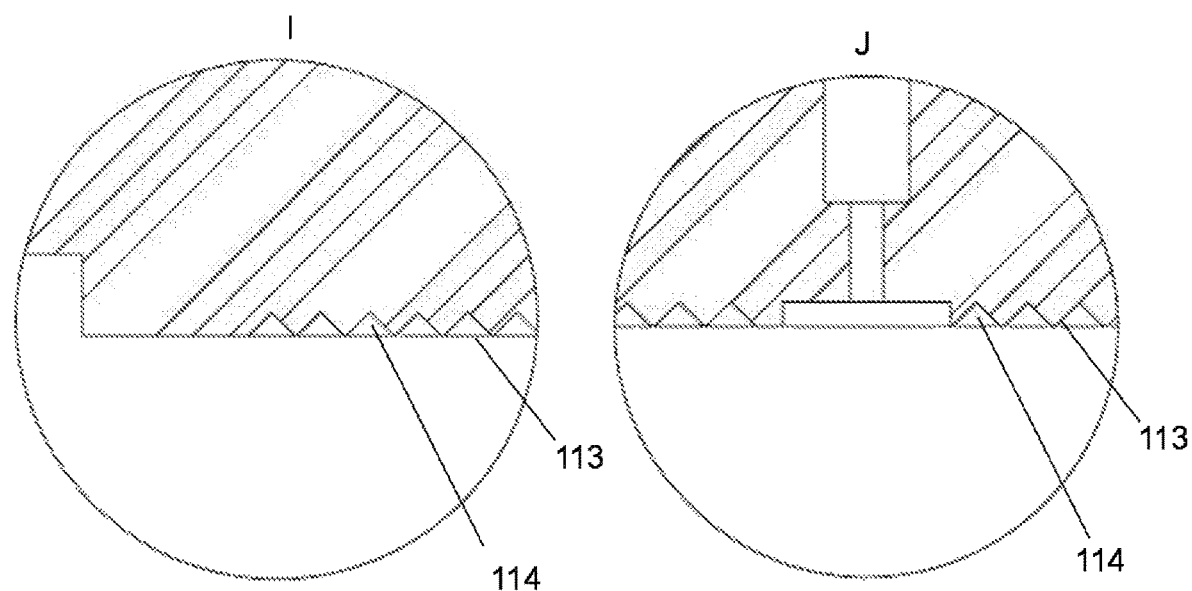
FIG. 3e illustrates a zoom-in view of circle I of FIG. 3d.
FIG. 3f illustrates a zoom-in view of circle J of FIG. 3d.

FIG. 3a is a bottom view of upper chamber portion 110 according to an embodiment of the present disclosure. FIG. 3b illustrates a zoom-in view of circle G of FIG. 3a, whereas FIG. 3c illustrates a zoom-in view of circle H of FIG. 3a. FIG. 3d illustrates a sectional view along a sectional line B-B of FIG. 3a. FIG. 3e illustrates a zoom-in view of circle I of FIG. 3d, whereas FIG. 3f illustrates a zoom-in view of circle J of FIG. 3d.

As illustrated in FIGS. 3a-3f, upper chamber portion 110 may include an upper chamber board 111 and a first protruding edge 112 that extends downward from a circumferential region of upper chamber board 111. Upper chamber portion 110 may have a recessed groove 114 formed on an internal surface 113 (which faces the micro chamber) of upper chamber portion 110. A groove wall portion of internal surface 113 (i.e., the portion between adjacent sections of recessed groove 114) may oppose a groove wall portion of internal surface 123 (i.e., the portion between adjacent sections of recessed groove 124), as shown in FIGS. 1b and 1c. Accordingly, when upper chamber portion 110 is in the closed position relative to lower chamber portion 120 and semiconductor wafer 200 is housed in the micro chamber, the groove wall portion of internal surface 113 of upper chamber portion 110 may abut against corresponding locations on semiconductor wafer 200. Semiconductor wafer 200 may thus abut more tightly against the groove wall portion of internal surface 123 of lower chamber portion 120, thereby enhancing a hermetical property (i.e., sealing) of the closed channel that is resulted. Alternatively, in some embodiments, the groove wall portion of internal surface 113 of upper channel portion 110 may be interlaced with the groove wall portion of internal surface 123 of lower channel portion 120.

In an alternative embodiment, upper chamber portion 110 and lower chamber portion 120 may have their physical structures interchanged, or may have a same physical structure. Namely, an upper surface of semiconductor wafer 200, together with recessed groove 114 of upper chamber portion 110, may form another closed channel. As a result, the processing fluid may flow in either or both of the closed channels and treat either the upper surface or the lower surface of semiconductor wafer 200, or both the upper and lower surfaces of semiconductor wafer 200 simultaneously.

Figure 4A:
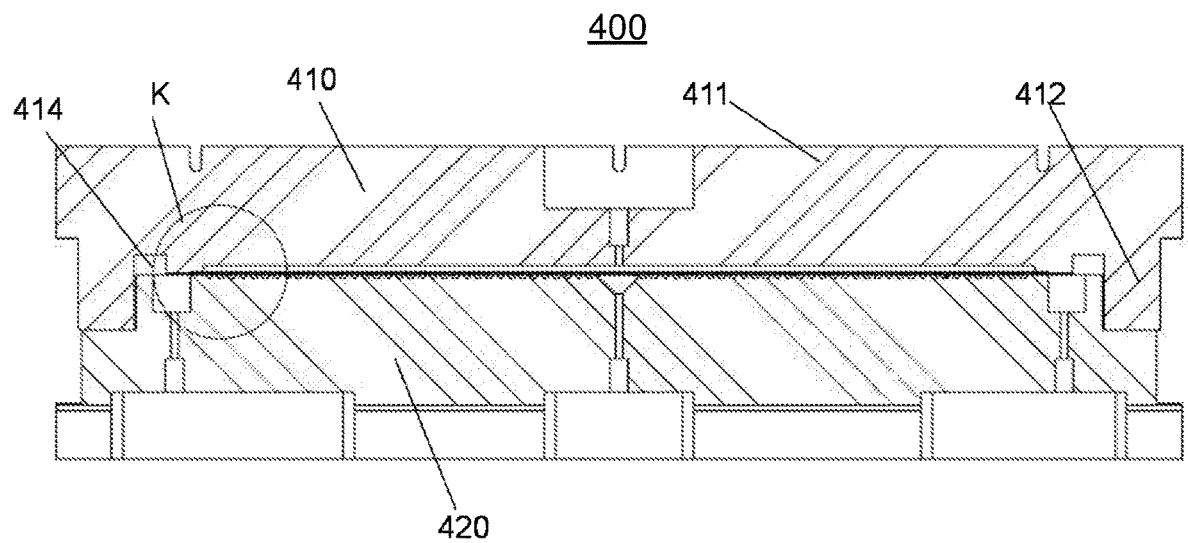
FIG. 4a is a sectional view of a semiconductor processing apparatus according to another embodiment of the present disclosure.
Figure 4B:
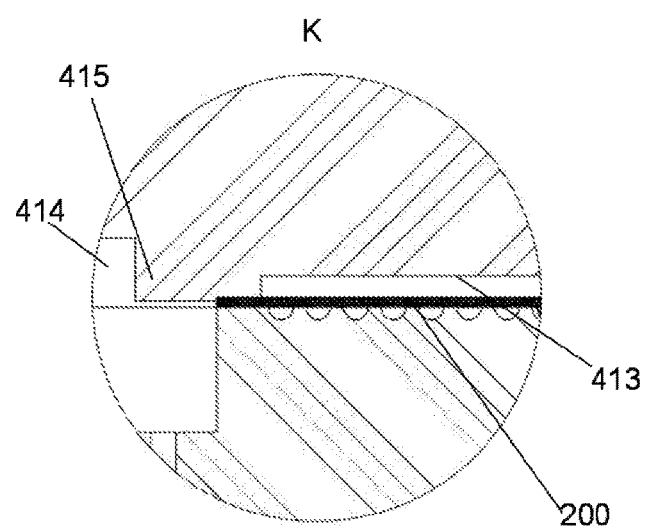
Figure 5A:
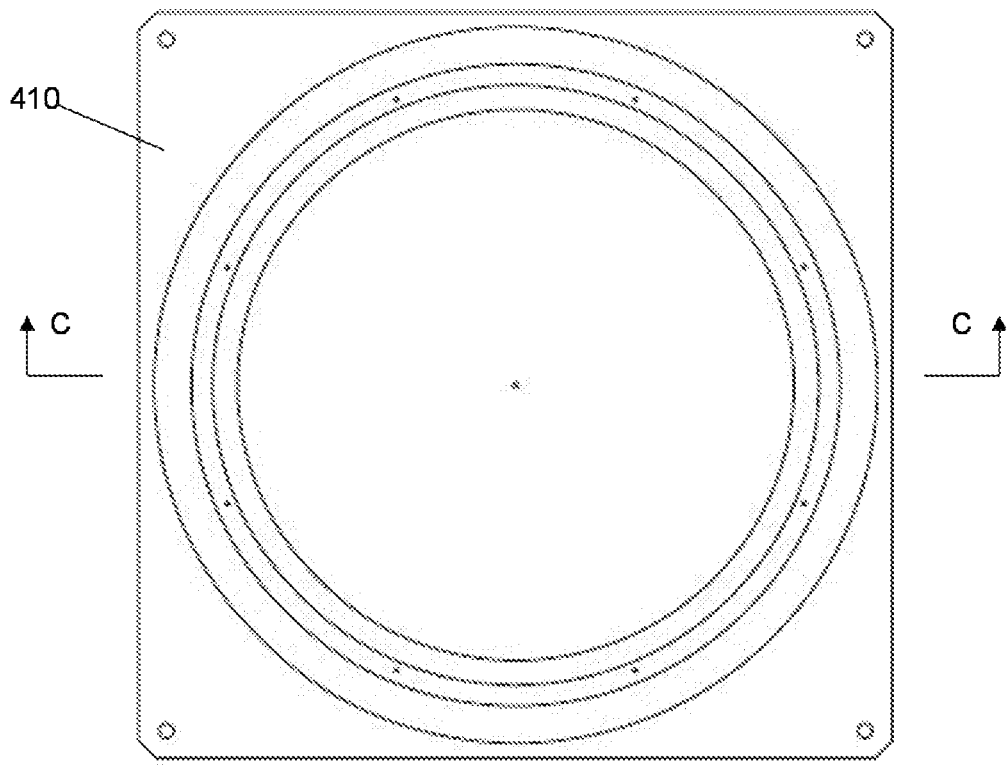
FIG. 5a is a bottom view of an upper chamber portion according to an embodiment of the present disclosure.
Figure 5B:
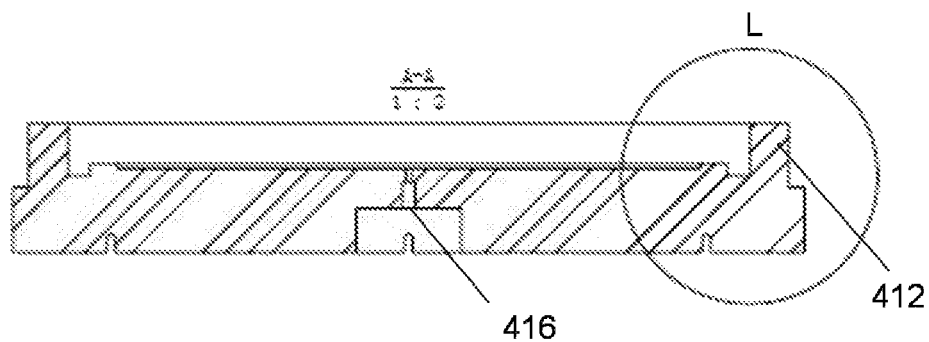
Figure 5C:
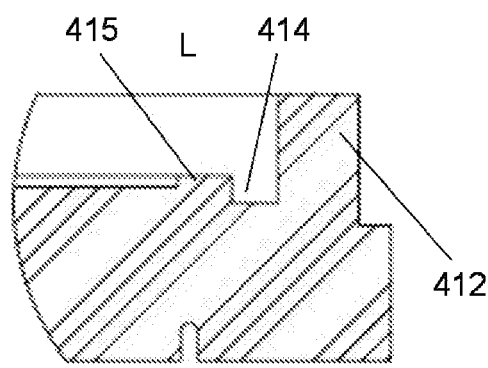
FIG. 5c illustrates a zoom-in view of circle L of FIG. 5b.

FIG. 4a is a sectional view of a semiconductor processing apparatus 400 according to another embodiment of the present disclosure. FIG. 4b illustrates a zoom-in view of circle K of FIG. 4a. Compared with semiconductor processing apparatus 100 of FIG. 1a, semiconductor processing apparatus 400 of FIG. 4a has an upper chamber portion 410 that has a different structure from upper chamber portion 110 shown in FIG. 1a. FIG. 5a is a bottom view of upper chamber portion 410 according to an embodiment of the present disclosure, and FIG. 5b illustrates a sectional view along sectional line C-C of FIG. 5a. FIG. 5c is a zoom-in view of circle L of FIG. 5b. As shown in FIGS. 5a-5c, 4a and 4b, upper chamber portion 410 may include an upper chamber board 411, a first protruding edge 412, a first internal surface 413 that faces the micro chamber, a second indentation 414, a second protruding edge 415 disposed between first internal surface 413 and second indentation 414, and a channel 416 located in a central region of first internal surface 413. As second protruding edge 415 abuts against semiconductor wafer 200, a closed space may be formed between first internal surface 413 and semiconductor wafer 200, and the closed space may be connected to an outer side of upper chamber portion 410 via channel 416. A fluid may enter the closed space via channel 416 and produce pressure in the closed space. The pressure may enable semiconductor wafer 200 to abut more tightly against the groove wall portion of lower chamber portion 120, thereby enhancing a hermetical property (i.e., sealing) of the closed channel that is resulted.

Figure 6A:
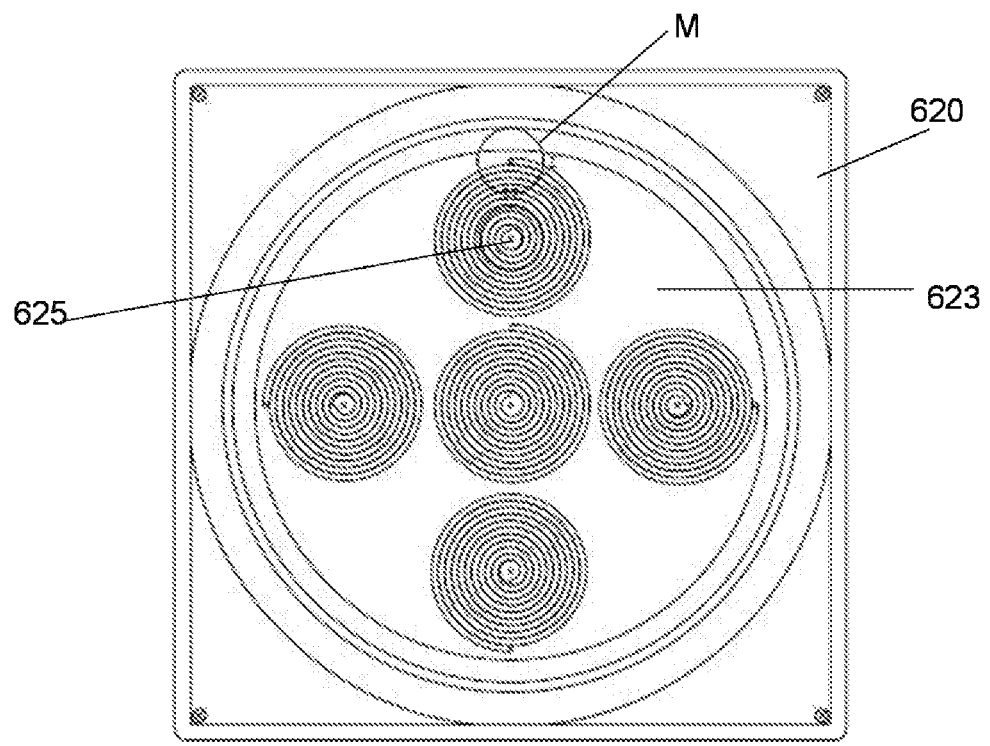
FIG. 6a is a top view of a lower chamber portion according to another embodiment of the present disclosure.
Figure 6B:
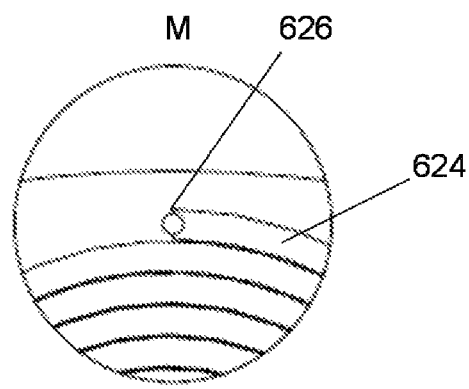

FIG. 6a is a bottom view of a lower chamber portion 620 according to another embodiment of the present disclosure. FIG. 6b illustrates a zoom-in view of circle M of FIG. 6a. A plurality of recessed grooves 624 may be formed on an internal surface 623 (which faces the micro chamber) of lower chamber portion 620. As shown in FIG. 6a, the plurality of recessed grooves 624 include five recessed grooves. In other embodiments, there may be recessed grooves of another quantity. Each of the plurality of recessed grooves 624 may have a first through-hole 625 and a second through-hole 626, respectively. Moreover, each of the plurality of recessed grooves 624 may be located in a respectively different region of internal surface 623. Consequently, mutually independent semiconductor treatments may be respectively applied to different regions of internal surface 623.

Figure 7:
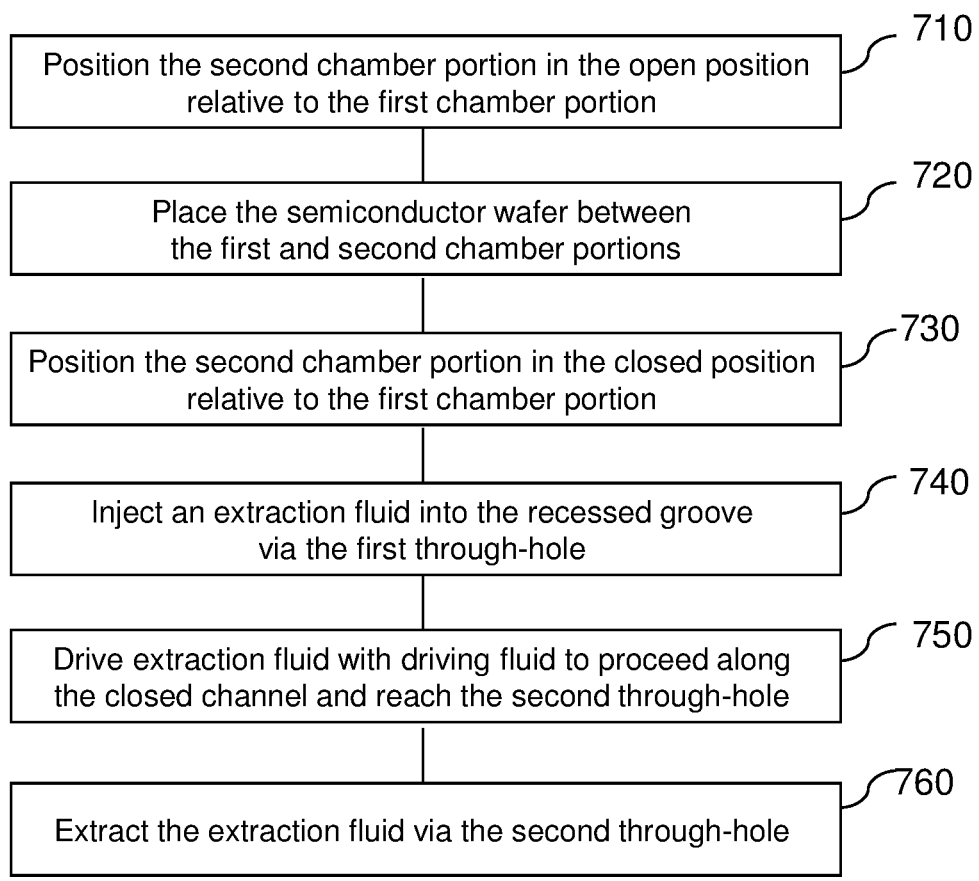
FIG. 7 is a flowchart of a semiconductor processing method according to an embodiment of the present disclosure

A semiconductor processing method 700 using any of the aforementioned semiconductor processing apparatuses is subsequently proposed, as shown in FIG. 7. Semiconductor processing method 700 includes the following steps.

Step 710 involves positioning lower chamber portion 120 in the open position relative to upper chamber portion 110.

Step 720 involves placing semiconductor wafer 200 between upper chamber portion 110 and lower chamber portion 120.

Step 730 involves positioning lower chamber portion 120 in the closed position relative to upper chamber portion 110.

Step 740 involves injecting an extraction fluid into recessed groove 124 via first through-hole 125.

Step 750 involves driving, with a driving fluid, the extraction fluid to proceed along the closed channel until the extraction fluid reaches second through-hole 126.

Step 760 involves extracting the extraction fluid via second through-hole 126.

In one embodiment, detection of chemical substances or elements may be conducted based on the extraction fluid that is extracted, so that any chemical substance or element left at the surface of the semiconductor wafer as a residual or pollution may be known, including a density of the element. This method may be used to detect surface pollution of a single-crystal silicon wafer that either does not have an insulation layer at its surface, or has an insulation layer that is easily dissolved in the extraction fluid.

In one embodiment, the extraction fluid may be a liquid or a gas. The driving fluid may be an inert ultra-pure gas or liquid, such as nitrogen, helium, argon, ultra-pure water, acetone, carbon tetrachloride, and the like.

In some embodiments, the method also involves injecting a reaction fluid into recessed groove 124 via first through-hole 125 before injecting the extraction fluid into the recessed groove. The reaction fluid may have a reaction with at least a partial area of the surface of the semiconductor wafer that the reaction fluid contacts. The method may then be used to detect surface pollution of a single-crystal silicon wafer having an insulation layer at its surface that is either difficult to dissolve or dissolving slowly in the extraction fluid.

FIG. 8a is a sectional view of a semiconductor processing apparatus according to an embodiment of the present disclosure. FIG. 8b illustrates a zoom-in view of circle AA of FIG. 8a, whereas FIG. 8c illustrates a zoom-in view of circle BB of FIG. 8a.

As illustrated in FIGS. 8a, 8b and 8c, semiconductor processing apparatus 800 includes an upper chamber portion 810 and a lower chamber portion 820. Upper chamber portion 810 may include an upper chamber board 811, whereas lower chamber portion 820 may include an upper chamber board 821. Compared with semiconductor processing apparatus 100 of FIGS. 1a, 1b and 1c, semiconductor processing apparatus 800 of FIGS. 8a, 8b and 8c is different in that lower chamber portion 820 may include an integral recess 823 formed on an internal surface (which faces the micro chamber) of lower chamber portion 820. Lower chamber portion 820 may also include a first through-hole 824 and a second through-hole 825. First through-hole 824 may pass through lower chamber portion 820 and connect to a central region of integral recess 823. Second through-hole 825 may pass through lower chamber portion and connect to a peripheral region of integral recess 823. The central region may be a low region of integral recess 823, whereas the peripheral region may be a high region of integral recess 823. Namely, integral recess 823 may be low in the center and high at the peripheral, and integral recess 823 may have a bottom surface that slopes or slants from the low region to the high region. A radial line extending from the central region toward the peripheral region along the bottom surface of integral recess 823 may be an oblique straight line or an oblique curve line.

In some embodiments, second through-hole 825 may include a plurality of second through-holes even distributed in the peripheral region of integral recess 823. Lower chamber portion 820 may further include a flow-guiding trench 826 formed on the internal surface of lower chamber portion 820. Flow-guiding trench 826 may surround integral recess 823 and connect the plurality of second through-holes 825.

When upper chamber portion 810 is in the closed position relative to lower chamber portion 820, a sealed micro chamber may be formed between upper chamber board 811 and lower chamber board 821. A semiconductor wafer 200 may be housed or otherwise accommodated in the micro chamber for subsequent processing. The semiconductor wafer may cover integral recess 823 such that a fluid processing space may be formed between semiconductor wafer 200 and the bottom surface of integral recess 823. There may not be a constant spacing between semiconductor wafer 200 and the bottom surface of integral recess 823. For example, a spacing between semiconductor wafer 200 and the bottom surface of integral recess 823 at the low region of integral recess 823 may be larger than a spacing between semiconductor wafer 200 and the bottom surface of integral recess 823 at the high region of integral recess 823. First through-hole 824 may be used as an inlet for a fluid, whereas second through-hole 825 may be used as an outlet for the fluid. In other embodiments, first through-hole 824 may be used as the outlet for the fluid, whereas second through-hole 825 may be used as the inlet for the fluid. Obviously, both first through-hole 824 and second through-hole 825 are connected to the fluid processing space.

When semiconductor processing apparatus 800 is in operation, a processing fluid may enter the fluid processing space via second through-hole 825. Due to gravity, processing fluid may flow toward first through-hole 824 along the bottom surface of integral recess 823. During the flowing, the processing fluid may contact and process a surface of semiconductor wafer 200. When certain amount of processing fluid enters via second through-hole 825 and fills the space formed between semiconductor wafer 200 and integral recess 823, the processing fluid that has processed the surface of semiconductor wafer 200 may exit via first through-hole 824 connected to integral recess 823. With the processing fluid continuously entering via second through-hole 825 and the processing fluid that has processed the surface of semiconductor wafer 200 continuously exiting via first through-hole 824, semiconductor wafer 200 may either maintain in a floating state under the affect by the processing fluid or abut against lower chamber portion 820. Due to the slope of integral recess 823 that guides toward the central region of integral recess 823, the processing fluid entering via second through-hole 825 may flow in a controlled flowing direction toward the central region of integral recess 823 due to gravity. Accordingly, processing fluid may flow with accurate control.

FIG. 9a is a sectional view of a semiconductor processing apparatus 900 according to an embodiment of the present disclosure. FIG. 9b illustrates a zoom-in view of circle EE of FIG. 9a, whereas FIG. 9c illustrates a zoom-in view of circle FF of FIG. 9a.

As illustrated in FIGS. 9a, 9b and 9c, semiconductor processing apparatus 900 includes an upper chamber portion 910 and a lower chamber portion 920. Upper chamber portion 910 may include an upper chamber board 911, whereas lower chamber portion 920 may include a lower chamber board 921. Compared with semiconductor processing apparatus 800 of FIGS. 8a, 8b and 8c, semiconductor processing apparatus 900 of FIGS. 9a, 9b and 9c is different in that a central region of integral recess 923 of lower chamber portion 920 may be a high region, whereas a peripheral region of integral recess 923 may be a low region. Namely, integral recess 923 may be high in the center and low at the peripheral. First through-hole 924 may connect to the high region of integral recess 923, whereas second through-hole 925 may connect to the low region of integral recess 923.

Figure 10:
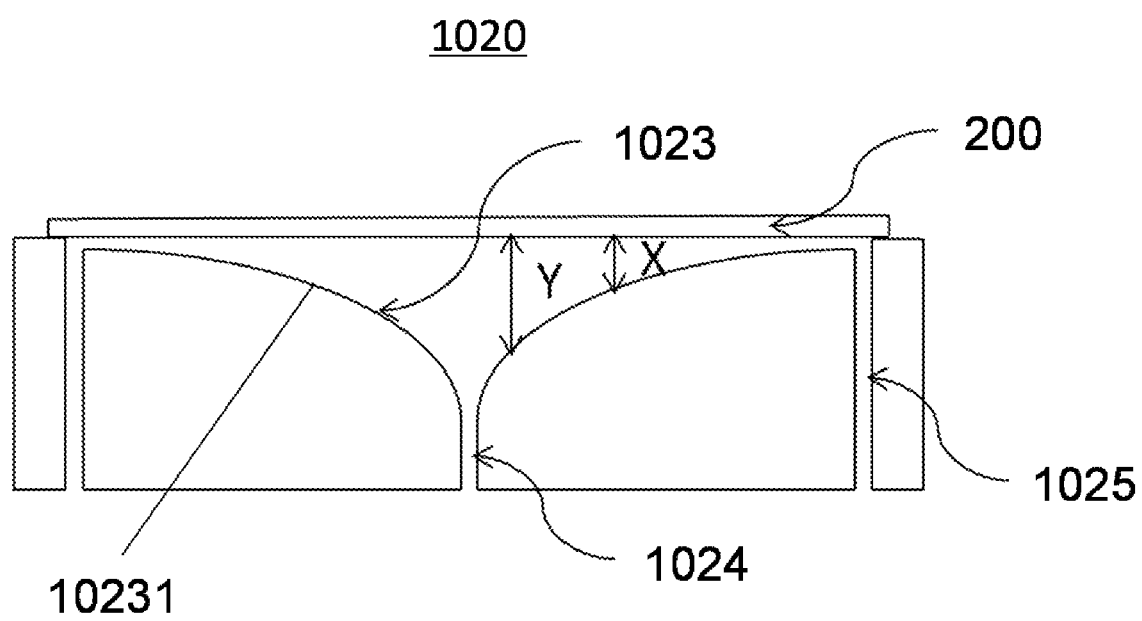
FIG. 10 is a sectional view of a lower chamber portion according to an embodiment of the present disclosure.

FIG. 10 is a sectional view of an embodiment according to an embodiment of the present disclosure. In particular, a shape of an integral recess 1023 is illustrated more eminently. As shown in FIG. 10, lower chamber portion 1020 may include integral recess 1023 that is formed on an internal surface of lower chamber portion 1020. Lower chamber portion 1020 may also include a first through-hole 1024 and a second through-hole 1025. First through-hole 1024 may pass through lower chamber portion 1020 and connect to a central region of integral recess 1023. Second through-hole 1025 may pass through lower chamber portion and connect to a peripheral region of integral recess 1023. The central region may be a low region of integral recess 1023, whereas the peripheral region may be a high region of integral recess 1023. That is, integral recess 1023 may have a bottom surface that slopes or slants from the low region to the high region. A radial line extending from the central region toward the peripheral region along the bottom surface of integral recess 1023 may be an oblique curve line 10231. A fluid processing space may be formed between semiconductor wafer 200 and the bottom surface of integral recess 1023. There may not be a constant spacing between semiconductor wafer 200 and the bottom surface of integral recess 1023.

As illustrated in FIG. 10, integral recess 1023 may have a circular projection in a vertical direction. Also as illustrated in FIG. 10, a spacing between semiconductor wafer 200 and the bottom surface of integral recess 1023 is shorter at X section as compared to that at Y section. The processing fluid (i.e., also referred as "fluid", in short) may enter integral recess 1023 via first through-hole 1024 that is located at a lower position. Initially, the fluid may stay around the center of integral recess 1023. As the processing fluid that has entered integral recess 1023 increases in volume, fluid may raise from the central region of integral recess 1023 toward the peripheral region of integral recess 1023, and may eventually exit integral recess 1023 via second through-hole 1025 located at the peripheral region of integral recess 1023. During this process, the fluid may initially contact a central region of a lower surface of semiconductor wafer 200. As the processing fluid that has entered integral recess 1023 increases in volume, an area of the lower surface of semiconductor wafer 200 that the fluid contacts may gradually enlarge toward the peripheral region of semiconductor wafer 200. As soon as the spacing between semiconductor wafer 200 and lower chamber portion 1020 is completely filled by the fluid, the fluid may cover an entire corresponding area of the lower surface of semiconductor wafer 200. With the fluid continuously entering via first through-hole 1024 and the fluid that has contacted the lower surface of semiconductor wafer 200 continuously exiting via second through-hole 1025, the fluid that continuously flows over the lower surface of semiconductor wafer 200 may constantly cause chemical and physical reactions at the lower surface of semiconductor wafer 200. The chemical and physical reactions may be directly affected by how the fluid contacts the lower surface of semiconductor wafer 200, such as a flowing angle or a flowing speed of the flow. Use integral recess 1023 of FIG. 10 as an example. An area of a flowing surface of the fluid at a location equals to a circumference of a circle times a gap dimension. The circle has a radius that equals to a distance between the location and the center of integral recess 1023, whereas the gap dimension is a spacing between integral recess 1023 and semiconductor wafer 200 at the location. As shown in FIG. 10, although the gap dimension at X location is smaller than the gap at Y location, the radius at Y location is smaller than the radius at X location. Given that the area of the flowing surface of the fluid equals to the circumference times the gap dimension, the area of the flowing surface of the fluid may be maintained at a constant value as long as the radius decreases at a rate or proportion that is the same as the gap distance increases at. For example, X location has a smaller gap distance but a larger radius with respect to the center of integral recess 1023. On the other hand, Y location has a larger gap distance but a smaller radius with respect to the center of integral recess 1023. Therefore, through proper design, the area of the flowing surface of the fluid at X and Y locations may be ensured to have a same value. When the area of the flowing surface of the fluid at various locations of integral recess 1023 is maintained at a constant value, a flowing speed of the fluid at the various locations of integral recess 1023 may also be maintained at a constant value. Accordingly, the fluid may process various locations of semiconductor wafer 200 to a constant degree. With the particular structure of integral recess 1023, the entire surface of semiconductor wafer 200 may substantially be processed to the constant degree.

In one embodiment, oblique curve line 10231 may have a shape of an analytical function of $y=-C/x$. C is a constant larger than 0. An origin of the analytical function is at a location of first through-hole 1024. A positive direction of the analytical function is a radial direction extending from the central region toward the peripheral region. Assuming that the fluid enters integral recess 1023 at a constant rate, a larger constant C may indicate a slower flowing speed at various locations of integral recess 1023, whereas a smaller constant C may indicate a faster flowing speed at various locations of integral recess 1023.

In one embodiment, oblique curve line 10231 may have a shape of an analytical function of $y=A*\ln(x)+C$. Each of A and C is a constant. An origin of the analytical function is at a location of first through-hole 1024. A positive direction of the analytical function is a radial direction extending from the central region toward the peripheral region. Through adjusting a value of each of constants A and C, the flowing speed of the fluid at various locations of integral recess 1023 may be controlled such that the flowing speed of the fluid may vary as the fluid flows from the central region of the surface of semiconductor wafer 200 toward the peripheral region thereof.

In a first situation, the flowing speed of the fluid may increase as the fluid flows from the central region of the surface of semiconductor wafer 200 toward the peripheral region thereof. In a second situation, the flowing speed of the fluid may decrease as the fluid flows from the central region of the surface of semiconductor wafer 200 toward the peripheral region thereof.

Figure 11A:
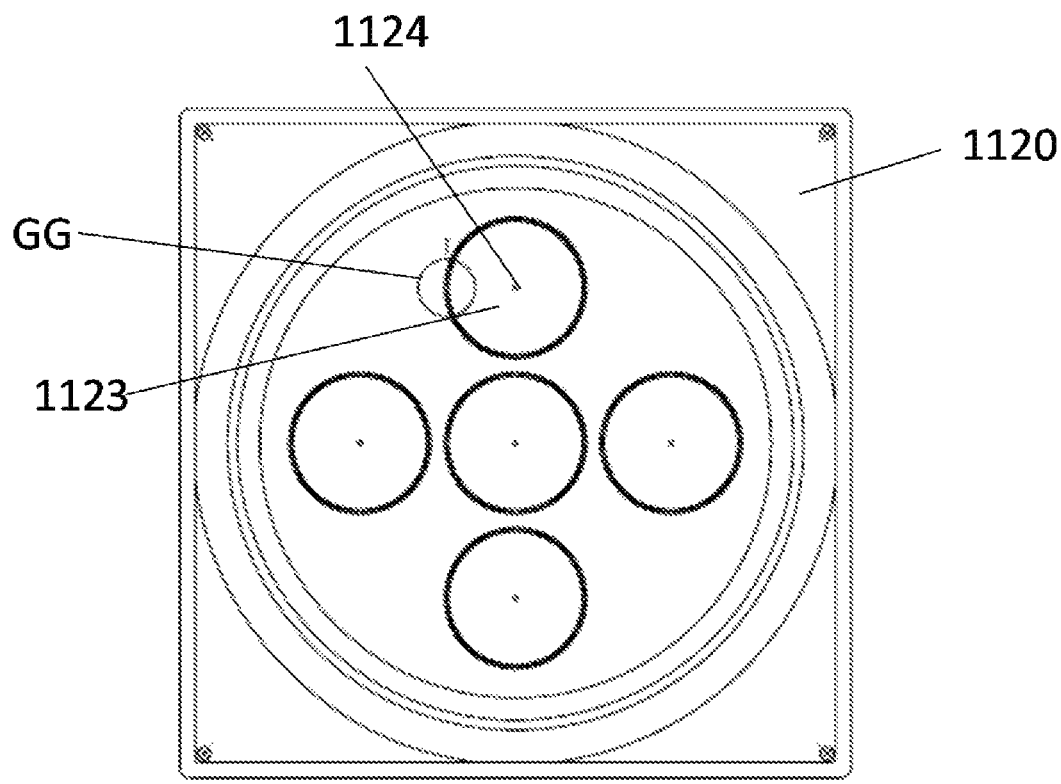
FIG. 11a is a top view of a lower chamber portion according to another embodiment of the present disclosure.
Figure 11B:
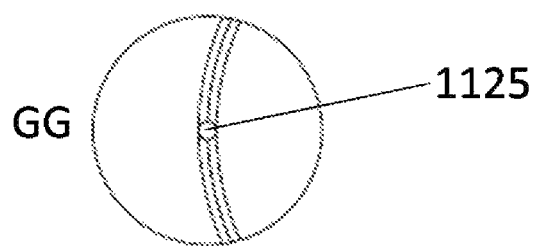

FIG. 11a is a top view of a lower chamber portion 1120 according to an embodiment of the present disclosure. FIG. 11b illustrates a zoom-in view of circle GG of FIG. 11a. As illustrated in FIGS. 11a and 11b, lower chamber portion 1120 may have a plurality of integral recesses 1123. Each of integral recesses 1123 may include a first through-hole 1124 and a second through-hole 1125. Each of integral recesses 1123 may be used to process a corresponding area of the semiconductor wafer.

In an alternative embodiment, the lower chamber portion has only a through-hole located in the low region of integral recess 823. The through-hole may serve as both an inlet and an outlet of the fluid.

The present disclosure has been described in sufficient details with a certain degree of particularity. It is understood to those skilled in the art that the present disclosure of embodiments has been made by way of examples only and that numerous changes in the arrangement and combination of parts may be resorted without departing from the spirit and scope of the present disclosure as claimed. Accordingly, the scope of the present disclosure is defined by the appended claims rather than the foregoing description of embodiments.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A semiconductor processing apparatus, comprising:
a first chamber portion; and
a second chamber portion movable relative to the first chamber portion between an open position and a closed position,
wherein:
when the second chamber portion is in the closed position relative to the first chamber portion, a micro chamber is formed between the first chamber portion and the second chamber portion, the micro chamber configured to house a semiconductor wafer,
when the second chamber portion is in the open position relative to the first chamber portion, the micro chamber is configured for the semiconductor wafer to be transferred into or out of the micro chamber,
the first chamber portion comprises:
a recessed area formed on an internal surface of the first chamber portion, the internal surface facing the micro chamber; and
a first through-hole and a second through-hole, the first through-hole passing through the first chamber portion from an outer side of the first chamber portion and connected to a first location of the recessed area, the second through-hole passing through the first chamber portion from the outer side of the first chamber portion and connected to a second location of the recessed area,
when the second chamber portion is in the closed position relative to the first chamber portion and the semiconductor wafer is housed in the micro chamber, a surface of the semiconductor wafer abuts against the internal surface such that the recessed area is sealed by the surface of the semiconductor wafer to form a closed processing space between the surface of the semiconductor wafer and the first chamber portion, the closed processing space connected to the outer side of the first chamber portion via the first through-hole and the second through-hole,
the recessed area comprises at least one recessed groove extending from the first location to the second location,
the closed processing space comprises at least one closed channel formed by the surface of the semiconductor wafer and the at least one recessed groove,
the at least one closed channel is configured to receive a fluid via the first through-hole, the fluid being driven to proceed in the at least one closed channel from the first location to the second location and exit the closed processing space via the second through-hole, and
the fluid is configured to contact and process at least a partial area of the surface of the semiconductor wafer while proceeding in the at least one closed channel.

2. The semiconductor processing apparatus according to claim 1, wherein:
the first through-hole comprises a first buffering mouth portion and a first through-hole portion, the first buffering mouth portion directly connected to the at least one recessed groove and being deeper and wider than the at least one recessed groove, the first through-hole portion directly connected to the first buffering mouth portion, and
the second through-hole comprises a second buffering mouth portion and a second through-hole portion, the second buffering mouth portion directly connected to the at least one recessed groove and being deeper and wider than the at least one recessed groove, the second through-hole portion directly connected to the second buffering mouth portion.

3. The semiconductor processing apparatus according to claim 2, wherein the first buffering mouth portion comprises a cone-shaped recess, wherein the second buffering mouth portion comprises a cylinder-shaped recess, and wherein the at least one recessed groove comprises a cross-section that is U-shaped, V-shaped, or semicircular.

4. The semiconductor processing apparatus according to claim 1, wherein the at least one recessed groove is formed as a spiral, wherein the first location is located in a central region of the spiral, and wherein the second location is located in a peripheral region of the spiral.

5. The semiconductor processing apparatus according to claim 1, the second chamber portion comprising:
a recessed groove formed on an internal surface of the second chamber portion, the internal surface of the second chamber portion facing the micro chamber,
wherein a groove wall portion of the internal surface of the first chamber portion opposes a groove wall portion of the internal surface of the second chamber portion.

6. The semiconductor processing apparatus according to claim 1, wherein:
the first chamber portion is an upper chamber portion and the second chamber portion is a lower chamber portion, or
the first chamber portion is a lower chamber portion and the second chamber portion is an upper chamber portion.

7. The semiconductor processing apparatus according to claim 1, wherein the at least one recessed groove comprises a plurality of recessed grooves, each of the plurality of recessed grooves having a first through-hole and a second through-hole, respectively.

8. The semiconductor processing apparatus according to claim 7, wherein each of the plurality of recessed grooves is located in a respective region of the internal surface.

9. A semiconductor processing apparatus, comprising:
a first chamber portion; and
a second chamber portion movable relative to the first chamber portion between an open position and a closed position,
wherein:
when the second chamber portion is in the closed position relative to the first chamber portion, a micro chamber is formed between the first chamber portion and the second chamber portion, the micro chamber configured to house a semiconductor wafer,
when the second chamber portion is in the open position relative to the first chamber portion, the micro chamber is configured for the semiconductor wafer to be transferred into or out of the micro chamber,
the first chamber portion comprises:
a recessed area formed on an internal surface of the first chamber portion, the internal surface facing the micro chamber; and
either or both of a first through-hole and a second through-hole, the first through-hole passing through the first chamber portion from an outer side of the first chamber portion and connected to a first location of the recessed area, the second through-hole passing through the first chamber portion from the outer side of the first chamber portion and connected to a second location of the recessed area,
when the second chamber portion is in the closed position relative to the first chamber portion and the semiconductor wafer is housed in the micro chamber, a surface of the semiconductor wafer abuts against the internal surface such that the recessed area is sealed by the surface of the semiconductor wafer to form a closed processing space between the surface of the semiconductor wafer and the first chamber portion, the closed processing space connected to the outer side of the first chamber portion via the first through-hole, the second through-hole, or both,
the recessed area comprises an integral recess,
the first location is located at a low region of the integral recess, and
the integral recess has a bottom surface sloping from the low region to a high region of the integral recess.

10. The semiconductor processing apparatus according to claim 9, wherein:
the first chamber portion comprises both the first through-hole and the second through-hole,
the second location is located at the high region,
the closed processing space is a fluid processing space formed between the surface of the semiconductor wafer and the bottom surface of the integral recess, the fluid processing space connected to the outer side of the first chamber portion via the first through-hole and the second through-hole, and
a first spacing between the surface of the semiconductor wafer and the bottom surface of the integral recess at the low region is larger than a second spacing between the surface of the semiconductor wafer and the bottom surface of the integral recess at the high region.

11. The semiconductor processing apparatus according to claim 10, wherein:
the integral recess has a circular shape,
the low region is located in a central region of the integral recess and the high region is located in a peripheral region of the integral recess, or
the high region is located in the central region of the integral recess and the low region is located in the peripheral region of the integral recess,
the first or second through-hole connected to the peripheral region of the integral recess comprises a plurality of through-holes, and
a radial line extending from the central region toward the peripheral region along the bottom surface of the integral recess is an oblique straight line or an oblique curve line.

12. The semiconductor processing apparatus according to claim 11, wherein the oblique curve has a shape of an analytical function of $y=-C/x$, C being a constant larger than 0, an origin of the analytical function being at a location of the first through-hole, a positive direction of the analytical function being a radial direction extending from the central region toward the peripheral region.

13. The semiconductor processing apparatus according to claim 11, wherein the oblique curve has a shape of an analytical function of $y=A*\ln(x)+C$, each of A and C being a constant, an origin of the analytical function at a location of the first through-hole, a positive direction of the analytical function being a radial direction extending from the central region toward the peripheral region.

14. A semiconductor processing method using a semiconductor processing apparatus,
the semiconductor processing apparatus comprising:
a first chamber portion; and
a second chamber portion movable relative to the first chamber portion between an open position and a closed position,
wherein:
when the second chamber portion is in the closed position relative to the first chamber portion, a micro chamber is formed between the first chamber portion and the second chamber portion, the micro chamber configured to house a semiconductor wafer,
when the second chamber portion is in the open position relative to the first chamber portion, the micro chamber is configured for the semiconductor wafer to be transferred into or out of the micro chamber,
the first chamber portion comprises:
a recessed groove formed on an internal surface of the first chamber portion, the internal surface facing the micro chamber; and
a first through-hole passing through the first chamber portion from an outer side of the first chamber portion and connected to the recessed groove,
a second through-hole passing through the first chamber portion from the outer side of the first chamber portion and connected to the recessed groove, and
when the second chamber portion is in the closed position relative to the first chamber portion and the semiconductor wafer is housed in the micro chamber, a surface of the semiconductor wafer abuts against the internal surface such that a closed channel is formed by the surface of the semiconductor wafer and the recessed groove, the closed channel connected to the outer side of the first chamber portion via the first and second through-holes;

the method comprising:
   positioning the second chamber portion in the open position relative to the first chamber portion;
   placing the semiconductor wafer between the first and second chamber portions;
   positioning the second chamber portion in the closed position relative to the first chamber portion;
   injecting an extraction fluid into the recessed groove via the first through-hole, the extraction fluid being driven by a driving fluid to proceeds along the closed channel and reaches the second through-hole, the driving fluid being an inert ultra-pure gas or liquid; and
   extracting the extraction fluid via the second through-hole.

15. The semiconductor processing method according to claim 14, further comprising:
   injecting a reaction fluid into the recessed groove via the first through-hole before the injecting of the extraction fluid, such that the reaction fluid has a reaction with at least a partial area of the surface of the semiconductor wafer that the reaction fluid contacts.

* * * * *